United States Patent
Kodama et al.

(10) Patent No.: US 9,673,349 B2
(45) Date of Patent: Jun. 6, 2017

(54) STRINGING DEVICE AND STRINGING METHOD AS WELL AS PHOTOVOLTAIC MODULE MANUFACTURING DEVICE AND MANUFACTURING METHOD

(75) Inventors: Seigo Kodama, Chiryu (JP); Noriaki Iwaki, Chiryu (JP); Shuichi Hirata, Chiryu (JP); Masato Suzuki, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 100 days.

(21) Appl. No.: 14/381,372

(22) PCT Filed: Feb. 28, 2012

(86) PCT No.: PCT/JP2012/054922
§ 371 (c)(1),
(2), (4) Date: Aug. 27, 2014

(87) PCT Pub. No.: WO2013/128568
PCT Pub. Date: Sep. 6, 2013

(65) Prior Publication Data
US 2015/0076214 A1 Mar. 19, 2015

(51) Int. Cl.
*B23K 3/00* (2006.01)
*B23K 31/00* (2006.01)
(Continued)

(52) U.S. Cl.
CPC ............ *H01L 31/188* (2013.01); *H01L 31/05* (2013.01); *Y02E 10/50* (2013.01)

(58) Field of Classification Search
CPC . H01L 31/188; H01L 31/0504; B23K 1/0008; B23K 2201/40; B23K 3/047;
(Continued)

(56) References Cited

U.S. PATENT DOCUMENTS

2008/0048007 A1* 2/2008 Chikaki ............... B23K 1/0008
228/101

FOREIGN PATENT DOCUMENTS

JP 2001-267614 9/2001
JP 2003-298095 10/2003
(Continued)

OTHER PUBLICATIONS

English computer translation of JP2003-298095A May 3, 2016.*
International Search Report issued May 15, 2012, in PCT/JP2012/054922, filed Feb. 28, 2012.

*Primary Examiner* — Erin Saad
(74) *Attorney, Agent, or Firm* — Oblon, McClelland, Maier & Neustadt, L.L.P.

(57) ABSTRACT

A stringing device and stringing method usable for manufacturing photovoltaic modules efficiently with an easy configuration, and a photovoltaic module manufacturing device and manufacturing method. A stringing device for electrically connecting electrodes formed respectively in adjacent photovoltaic cells via a conductive member includes: number one joining unit which joins the photovoltaic cell supplied with its light receiving surface facing up and the conductive member to each other; and number two joining unit which joins the photovoltaic cell supplied with its light receiving surface facing down and the conductive member to each other.

6 Claims, 14 Drawing Sheets

(51) Int. Cl.
*H01L 31/18* (2006.01)
*H01L 31/05* (2014.01)

(58) Field of Classification Search
CPC .... B23K 3/08; B23K 3/085; H05K 2203/101; H05K 3/3494
See application file for complete search history.

(56) References Cited

FOREIGN PATENT DOCUMENTS

| | | |
|---|---|---|
| JP | 2005-236235 | 9/2005 |
| WO | 03/072500 A1 | 9/2003 |

* cited by examiner

FIG.13
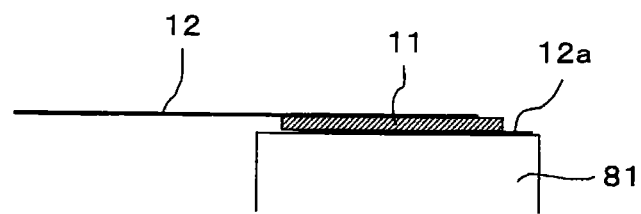
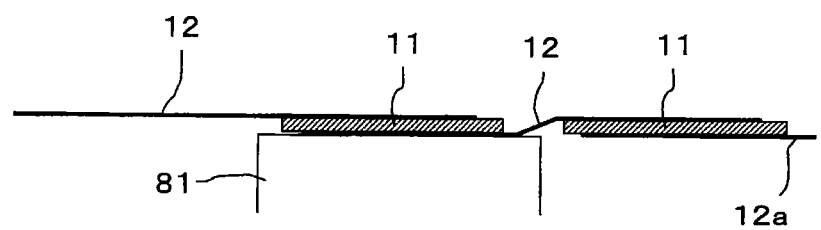
FIG.14
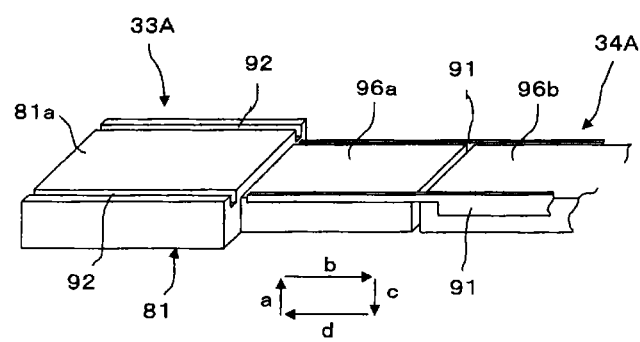

STRINGING DEVICE AND STRINGING METHOD AS WELL AS PHOTOVOLTAIC MODULE MANUFACTURING DEVICE AND MANUFACTURING METHOD

TECHNICAL FIELD

The present invention relates to a stringing device and stringing method for electrically connecting adjacent photovoltaic cells via a conductive member, as well as a manufacturing method and photovoltaic module manufacturing device equipped with a stringing device.

BACKGROUND ART

Conventionally, for photovoltaic modules (solar panels) with multiple photovoltaic cells which have a negative electrode formed on the light receiving surface and a positive electrode on the reverse side arranged horizontally and vertically, interconnectors are used to string together the multiple photovoltaic cells. In other words, interconnectors are used to perform stringing by connecting together an electrode of one photovoltaic cell and an electrode of an adjacent photovoltaic cell. As an example of this type of photovoltaic module, that disclosed in patent literature 1 is known.

An item disclosed in patent literature 1 is one which electrically connects each electrode of adjacent photovoltaic cells using one interconnector. Due to this, for an item disclosed in patent literature 1, as shown in FIG. 4 and FIG. 5 (embodiment 1), after interconnector 2 is connected to the upper surface of photovoltaic cell C, photovoltaic cell C is inverted 180 degrees around cell rotating axis 14 and interconnector 2 is positioned at the lower side of photovoltaic cell C. In this state, heated metal 8 is pushed against this in order to electrically connect each electrode of adjacent photovoltaic cells C via interconnector 2.

Also, for an item disclosed in patent literature 1, as shown in FIG. 10 and FIG. 11 (embodiment 2) or FIG. 13 and FIG. 14 (embodiment 3), with the light receiving surface of photovoltaic cell C facing up, or facing down, each electrode of adjacent photovoltaic cells C are electrically connected via interconnector 2 by pushing heated metal 8 against thereof from below without inverting photovoltaic cells C.

CITATION LIST

Patent Literature

PTL 1: JP-A-2003-298095

SUMMARY OF INVENTION

Technical Problem

In this way, for an item disclosed in patent literature 1, because stringing is performed while inverting every other photovoltaic cell C connected to interconnector 2, or by pushing heated metal 8 against thereof from below, there is the problem that the manufacturing equipment for stringing is complex.

Further, in order to manufacture photovoltaic modules by lining up in multiple rows the required quantity of strung photovoltaic cells, it is necessary to create two different types of string structures with the required quantity of photovoltaic cells strung and to wire these together in a matrix, but for the manufacturing method of patent literature 1, there are the problems that the manufacturing equipment becomes even more complex and that photovoltaic modules cannot be manufactured efficiently.

The present invention is an item which solves the above current problems whose object is a stringing device and stringing method suitable for efficiently manufacturing photovoltaic modules in a simple structure, as well as a photovoltaic module manufacturing device and manufacturing method.

Solution to Problem

The present invention is a stringing device for electrically connecting electrodes formed respectively in adjacent photovoltaic cells via a conductive member, comprising: number one joining unit which joins the photovoltaic cell supplied with its light receiving surface facing up and the conductive member to each other; and number two joining unit which joins the photovoltaic cell supplied with its light receiving surface facing down and the conductive member to each other.

With this kind of configuration, by using a simple configuration to join photovoltaic cells supplied with the direction of their light receiving surface changed to a conductive member, it is possible to easily manufacture two types of strung photovoltaic cells with different conductive member wiring constructions, and to realize a stringing device which is capable of efficiently manufacturing photovoltaic modules. Brief Description of

BRIEF DESCRIPTION OF DRAWINGS

FIG. 13 This is a drawing showing the interconnectors and photovoltaic cells layered on the joining unit.

FIG. 14 This is a drawing showing the conveyance members of the cell conveyance unit of the stringing device.

DESCRIPTION OF EMBODIMENTS

The following describes a photovoltaic cell stringing device and photovoltaic module manufacturing device of an embodiment of the present invention.

Figure 1:
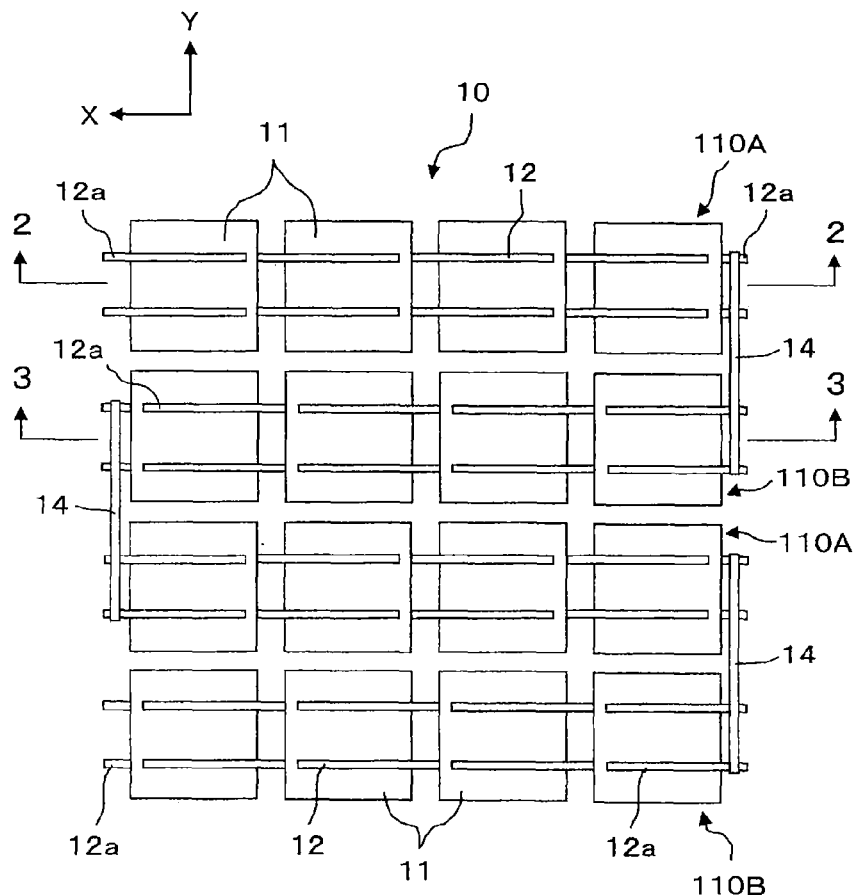
FIG. 1 This is an outline top view showing a photovoltaic module.

FIG. 1 is an outline view showing an example of photovoltaic module (solar panel) 10; photovoltaic module 10 comprises multiple (Xm cells in the X direction and Yn lines in the Y direction which is orthogonal to the X direction) photovoltaic cells 11 arranged flat in the XY direction and electrically connected in series. FIG. 1, for ease of understanding, shows an example of photovoltaic module 10 constructed from four cells Xm and 4 lines Yn making a total of sixteen photovoltaic cells 11.

Photovoltaic cells 11 connected in the X direction are electrically connected via interconnector 12 as a conductive member. Interconnector 12 is an item in a straight line which has a length in the X direction straddling two adjacent photovoltaic cells 11, and, as shown in FIG. 2 and FIG. 3, the right edge (front half) of the lengthways direction thereof is joined to the negative electrode formed in the lower surface (light receiving surface) or the positive electrode formed in the upper surface (reverse surface) of photovoltaic cell 11, and the left edge (latter half) of the lengthways direction thereof is joined to the positive electrode formed in the upper surface of photovoltaic cell 11 or the negative electrode formed in the lower surface.

On photovoltaic cells 11 arranged at both ends in the X direction, interconnectors 12a which are shorter than interconnectors 12 with a length straddling two photovoltaic cells 11 are joined to the lower surface (negative electrode) or upper surface (positive electrode) of photovoltaic cells 11. Each end of those short interconnectors 12a protrude slightly from both ends of photovoltaic cells 11.

By this, the required quantity Xm of photovoltaic cells 11 arranged in the X direction are electrically connected in series to form strung photovoltaic cell groups 110A and 110B. Additionally, the required quantity of lines Yn of those photovoltaic cell groups 110A and 110B are arranged in the Y direction, and photovoltaic module 10 is formed by matrixing the corresponding short interconnectors 12a.

Figure 2:
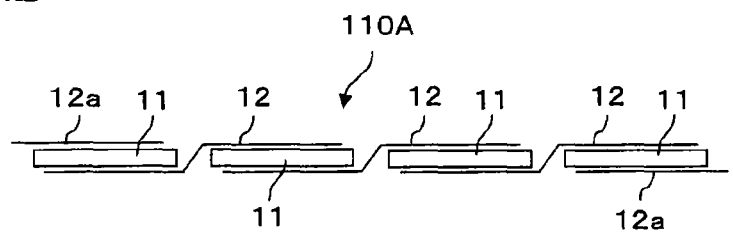
FIG. 2 This is a cross section view along line 2-2 of FIG. 1.
Figure 3:
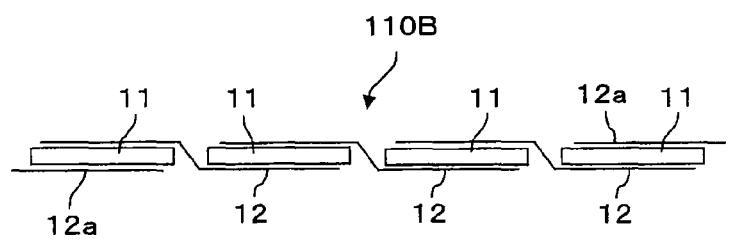
FIG. 3 This is a cross section view along line 3-3 of FIG. 1.

Here, in the odd numbered rows of photovoltaic cell groups 110A as seen from above in FIG. 1, as shown in FIG. 2, each end of short interconnectors 12a protrudes slightly from the upper surface and lower surface of photovoltaic cells 11 at the left and right ends; while in the even numbered rows of photovoltaic cell groups 110B as seen from above in FIG. 1, as shown in FIG. 3, each end of short interconnectors 12a protrudes slightly from the lower surface and upper surface of photovoltaic cells 11 at the left and right ends.

In this way, photovoltaic module 10 is formed from two types of photovoltaic cell groups 110A and 110B (hereafter referred to as number 1 photovoltaic cell group 110A and number 2 photovoltaic cell group 110B) with different interconnector 12 joining constructions, with these number 1 and number 2 photovoltaic cell groups 110A and 110B arranged alternately in the Y direction.

Additionally, each end of interconnectors 12a protruding from both end sections of odd numbered number 1 photovoltaic cell group 110A and each end of interconnectors 12a protruding from both end sections of even numbered number 2 photovoltaic cell group 110B are joined to each other as shown in FIG. 1 by busbar 14 which is used as a conductive member, whereby all photovoltaic cells 11 which go to form photovoltaic module 10 are connected in series.

Generally photovoltaic modules 10 are completed products in which cover glass made from transparent toughened glass is arranged on the light receiving surface (negative electrode) and a back sheet with excellent weather resistance properties is arranged on the reverse surface (positive electrode), and multiple photovoltaic cells 11 are sealed between the cover glass and back sheet using a resin such as EVA; however, for the embodiment below, for convenience of description, Xm×Yn photovoltaic cells 11 arranged on the cover glass are referred to photovoltaic module 10.

Figure 4:
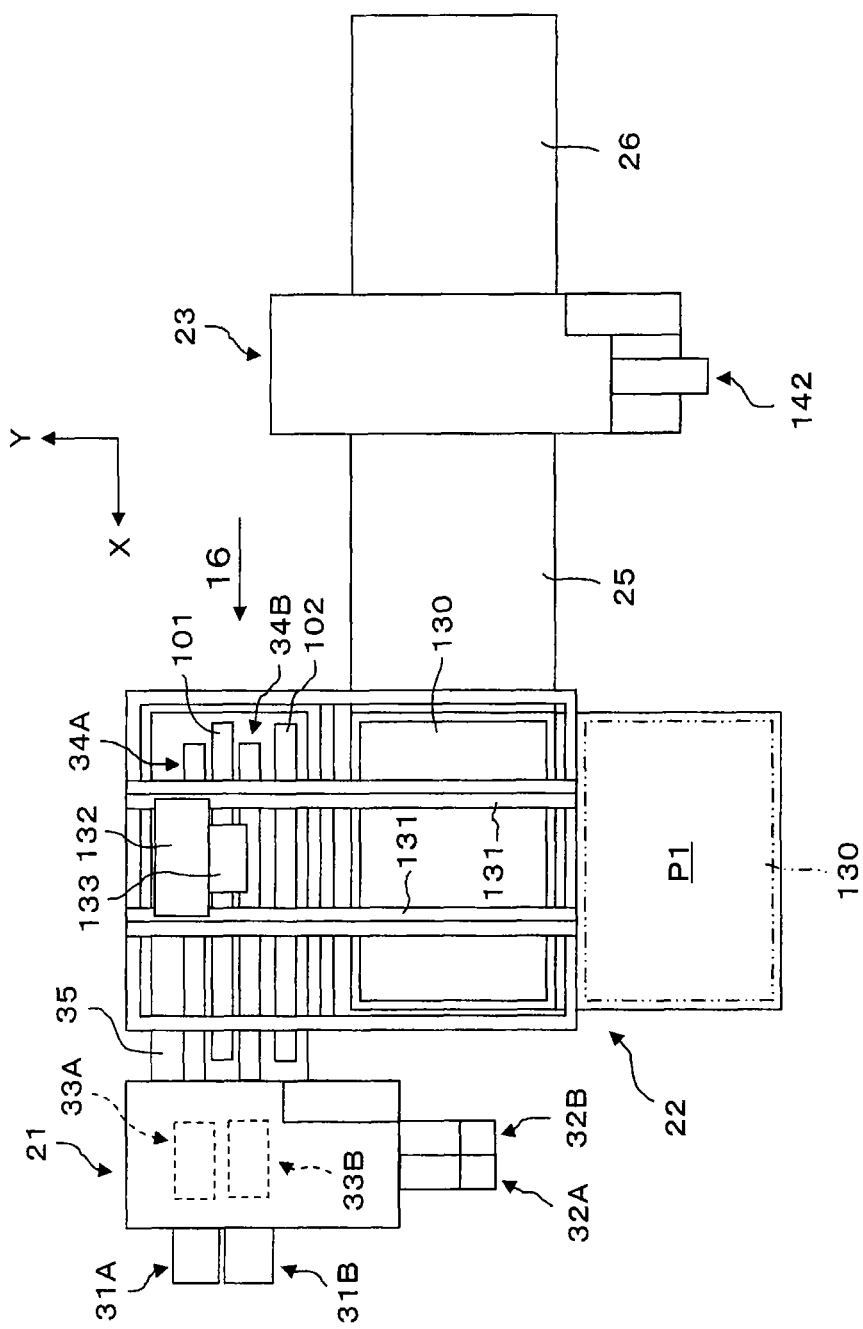
FIG. 4 This is a top view showing the overall photovoltaic module manufacturing device of an embodiment of the present invention.

Next, the following describes the detailed configuration of the manufacturing device for manufacturing photovoltaic modules 10 with the configuration outlined above. The manufacturing device, as shown in FIG. 4, comprises stringing device (stringing process) 21, layup device (layup process) 22, and matrixing device (matrixing process) 23 arranged along the X direction. Layup device 22 and matrixing device 23 are connected by conveyor 25, and photovoltaic modules 10 wired together in a matrix by matrixing device 23 are conveyed to the next process by conveyor 26.

In order to wire together number 1 and number 2 photovoltaic cell groups 110A and 110B in a string, stringing device 21 comprises mainly of two connector supply units (conductive member supply units) 31A and 31B for supplying interconnectors 12, two cell supply units 32A and 32B for supplying photovoltaic cells 11, two joining units 33A and 33B for joining interconnectors 12 to photovoltaic cells 11, and two rows of cell conveyance units 34A and 34B for conveying photovoltaic cells 11 to which interconnectors 12 have been joined, and these sets (two rows) of two units are arranged in parallel to each other.

These connector supply units 31A and 31B, cell supply units 32A and 32B, joining units 33A and 33B, and cell conveyance units 34A and 34B are arranged on shared base 35. Below, each set of units for manufacturing number one photovoltaic cell group 110A is referred to as unit one and each set of units for manufacturing number two photovoltaic cell group 110B is referred to as unit two for distinguishing purposes.

Figure 5:
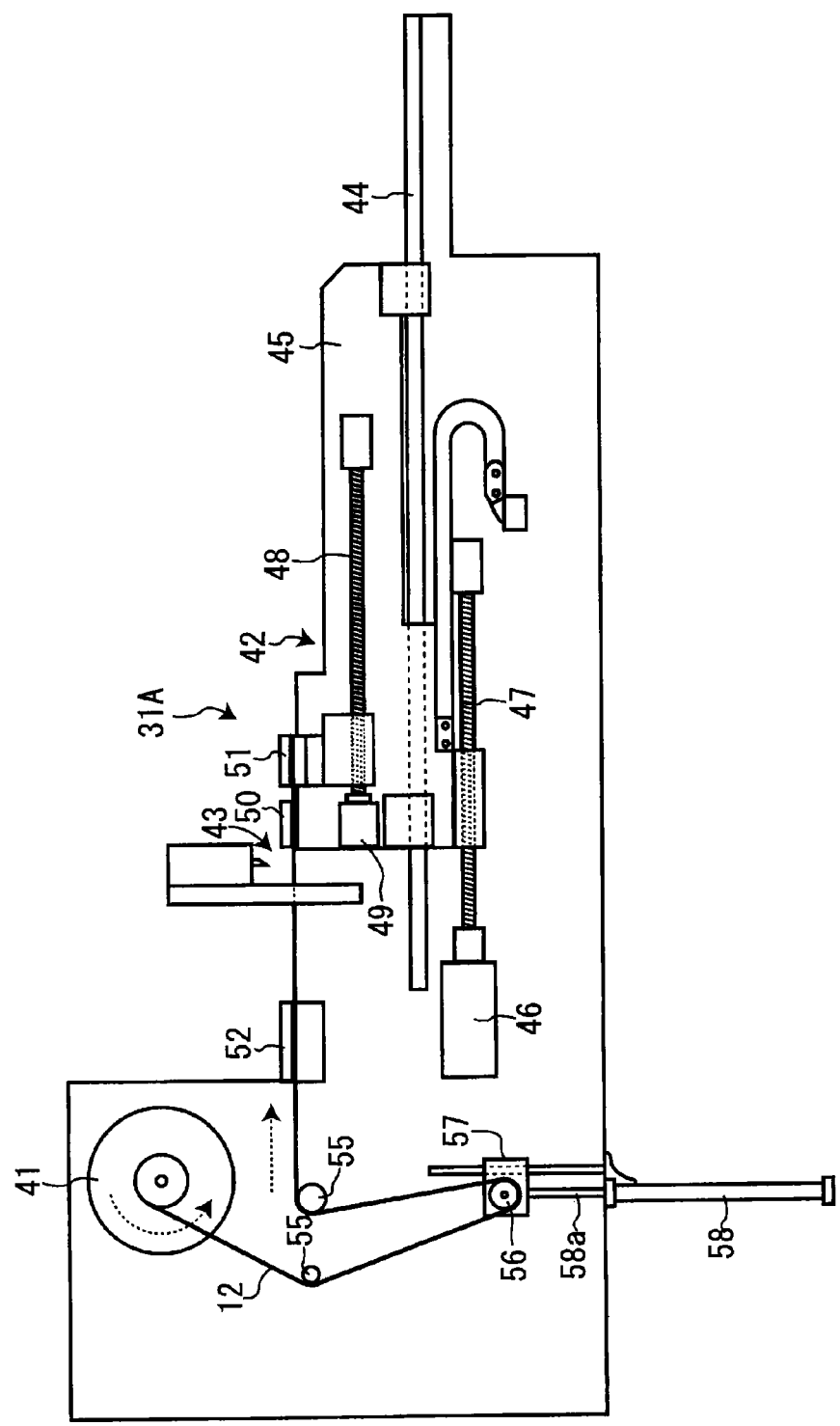
FIG. 5 This is an outline side view showing the connector supply unit of the stringing device.

The number one connector supply unit 31A, as shown in FIG. 5, comprises multiple rows (in the embodiment, two rows) of bobbin 41 separated in the Y direction around which is wound interconnector 12, pulling out means 42 for clamping each end of interconnector 12 wound around bobbin 41 and pulling it in the X direction, and up/down movable cutter 43 for cutting to a predetermined length interconnector 12 which has been pulled by pulling out means 42 to a predetermined position.

Pulling out means 42 has a moving platform 45 movably attached to guide rail 44 which is formed in the X direction, and moving platform 45 is moved a predetermined amount in the X direction along guide rail 44 by the rotation of number one ball screw axis 47 which is rotated by motor 46.

On moving platform 45, number two ball screw axis 48 is rotatably attached around an axis line parallel to number one ball screw 47, and number two ball screw axis 48 is rotated by motor 49 provided on moving platform 45. Also, moving guide 50 for guiding interconnectors 12 is fixed to moving platform 45.

Number one and number two clampers 51 and 52 which clamp interconnectors 12 pulled from bobbin 41 are provided on pulling out means 42, and number one and number two clampers 51 and 52 are capable of clamping and unclamping interconnectors 12 by the operation of an actuator which has been omitted from the drawing. Number one clamper 51 is located in a position downstream from cutter 43 and number two clamper 52 is located in a position upstream from cutter 43.

Number one clamper 51 is engaged with number two ball screw axis 48 and can be moved a predetermined amount in the X direction after clamping the end of interconnector 12. On the other hand, number two clamper 52 is provided such that it is advanced a fixed amount in the X direction by a cylinder not shown in the drawing, so that when interconnector 12 is cut to a predetermined length it clamps the base portion of interconnector 12 to be cut.

Interconnector 12 pulled from bobbin 41 is pulled while being guided along multiple guide rollers 55. In a position below and between multiple guide rollers 55, engagement roller 56 is provided on raising/lowering member 57 which can move up and down, and interconnector is wrapped around this engagement roller 56 and bent into a U-shape and guided by fixed number two clamper 52.

Guide roller (downstream guide roller) 55 which is downstream to engagement roller 56 is shared by multiple interconnectors 12 which are to be joined to photovoltaic cells 11, and the outer surface thereof is provided with multiple grooves aligned with the joining position in the Y direction of interconnector 12 for multiple types of photovoltaic cells 11. By this, when interconnector 12 is pulled from bobbin 41, even when it is pulled from bobbin 41 and the position moved in the Y direction, when it is pulled around the downstream roller, it is definitely aligned with the joining interval in the Y direction of interconnector 12. Further, because grooves aligned with the joining interval in the Y direction of each interconnector 12 for multiple types of photovoltaic cells are provided in advance, it is easy to change production to differing photovoltaic cells 11. Also, interconnector 12 is pulled by downstream guide roller 55 at an acute angle in the opposite direction to the winding curl direction of bobbin 41.

Piston rod 58a of tension cylinder 58 is connected to raising/lowering member 57, and tension cylinder 58 draws interconnector 12 via raising/lowering member 57 with a tensile force smaller than the power required to break interconnector 12. The tensile force of tension cylinder 58 can be changed in accordance with the type (power required to break) of interconnector 12.

Figure 6:
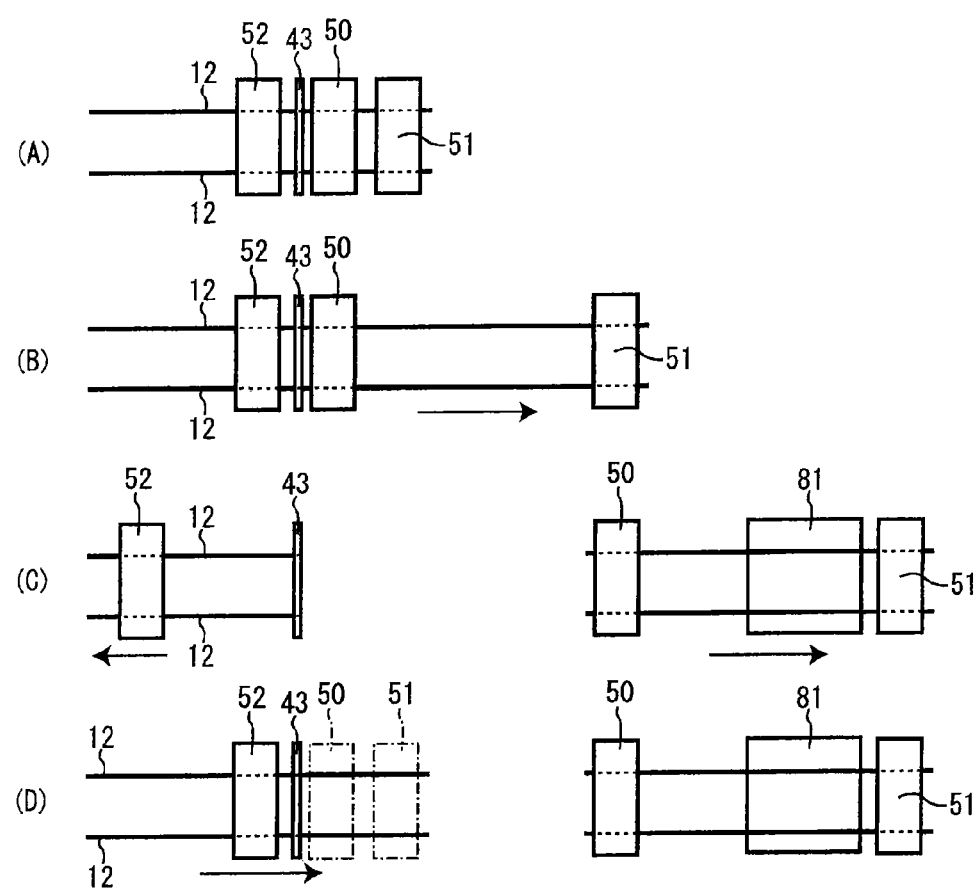
FIG. 6 This is illustration of cutting the interconnectors to a predetermined length and then drawing out.

The means for cutting to a predetermined length interconnectors 12 pulled by bobbin 41 of number 1 connector supply unit 31A and supplying them onto photovoltaic cell 11 loaded on lower section hot plate 81 (refer to FIG. 11) of number 1 joining unit 33A is shown in FIG. 6. First, from the initial position shown by FIG. 6 (A), by rotating number two ball screw axis 47 by a predetermined amount using number two motor 49, number one clamper 51 which has clamped an end of interconnectors 12 is advanced forward to a specified position and interconnectors 12 are pulled by a predetermined amount, as shown in FIG. 6 (B). Thereafter, cutter 43 is lowered and cuts interconnectors 12 to a predetermined length.

Next, by moving moving platform 45 a predetermined amount via the rotation of number one ball screw axis 47 using number one motor 46, number one clamper 51 is moved along with moving guide 50 as one with moving platform 45 (refer to FIG. 6 (C)). By this, number one clamper 51 is moved above lower section hot plate 81, and the predetermined length of interconnectors 12 which are clamped by this are supplied onto photovoltaic cell 11 loaded on lower hot plate 81.

At the same time, number two clamper 52 is unclamped and retracted a specified amount, and after that, with interconnectors 12 clamped by number two clamper 52, number two clamper 52 is advanced a specified amount and interconnectors 12 are pulled to cutter 43 front position (refer to FIG. 6 (D)). Along with this, number one clamper is unclamped, and by number one clamper 51 being returned to its original position along with moving platform 45 by number one and number two motors 46 and 49 (refer to FIG. 6 (A)), interconnectors 12 are layered on photovoltaic cell 11.

Incidentally, when interconnectors 12 clamped by number one clamper 51 are pulled out by number two motor 49, by setting that movement speed appropriately (for example, 1 G), interconnectors 12 can be drawn against the tensile force of tension cylinder 58. By this, the winding curl of interconnectors 12 with winding curl which are wound around bobbin 41 can be removed and corrected to be straight. Here, because interconnectors 12 are being drawn by a tensile force smaller than the force required to break them, if the tensile force acting on interconnectors 12 becomes larger, raising/lowering member 57 is raised so that excess tensile force is not acted on interconnectors 12, and it is possible to remove the winding curl.

Number two connector supply unit 31B has the same configuration as the above number one connector supply unit 31A, and cuts interconnectors 12 pulled by bobbin 41 to a predetermined length while removing the winding curl and supplies them onto photovoltaic cell 11 loaded on lower section hot plate 81 (refer to FIG. 11) of number two joining unit 33B.

Number one cell supply unit 32A orients photovoltaic cells 11 with the light receiving surface facing down and conveys them in the Y direction and is the item for supplying to number one joining unit 33A, and number two cell supply unit 32B orients photovoltaic cells 11 with the light receiving surface facing up and conveys them in the Y direction and is the item for supplying to number one joining unit 33B.

Figure 7:
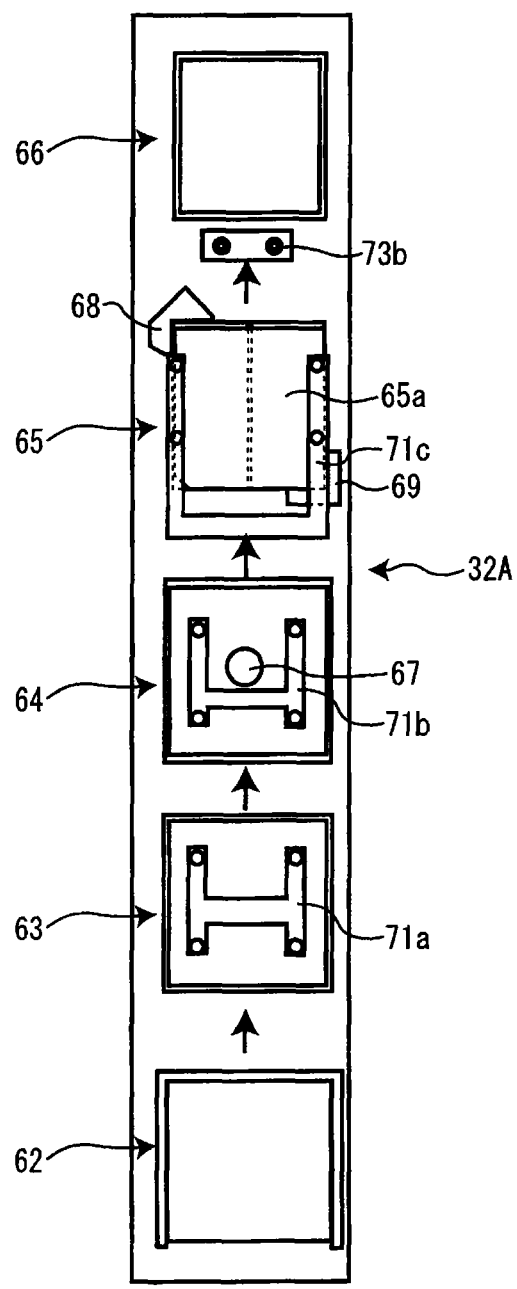
FIG. 7 This is an outline top view showing the cell supply unit of the stringing device.
Figure 8:
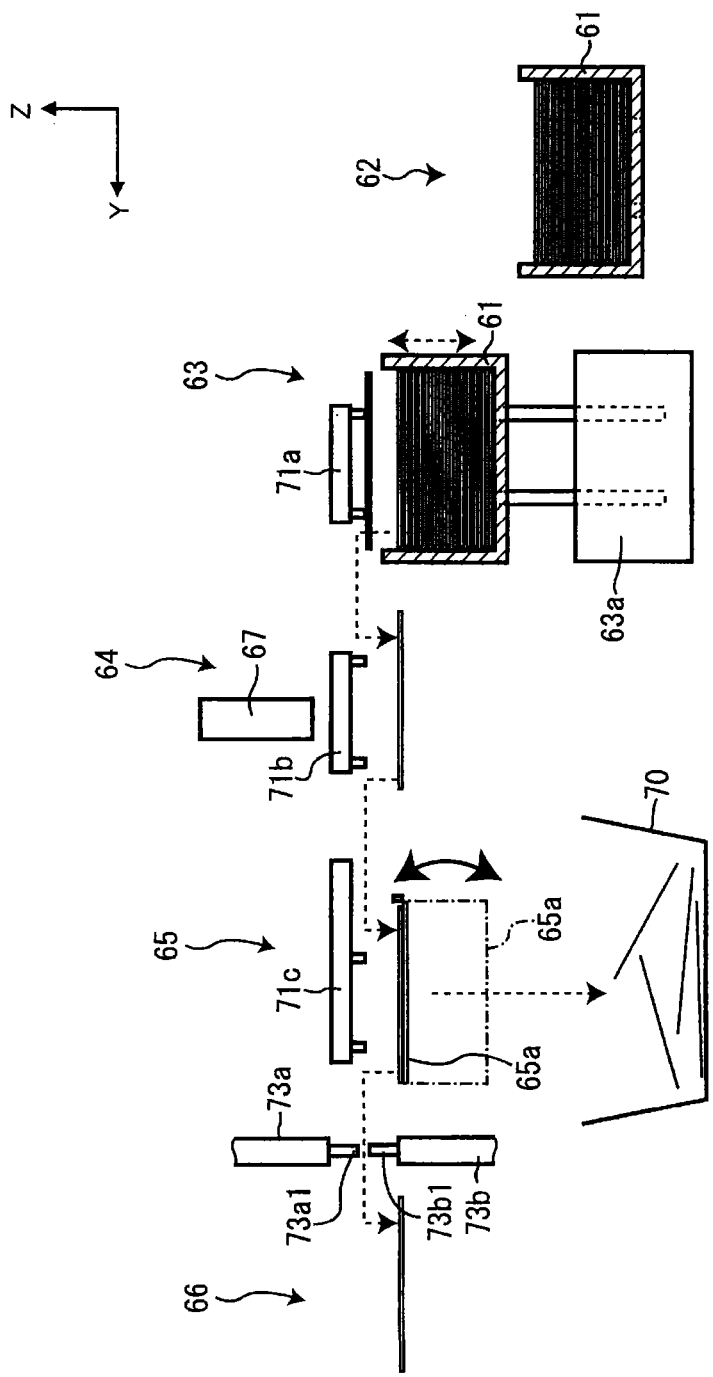
FIG. 8 This is an illustration showing the photovoltaic cell supply procedure of the cell supply unit.

As shown in FIG. 7 and FIG. 8, cell supply station for supplying cassettes 61 stacked with multiple photovoltaic cells 11 oriented with the light receiving surface facing down, cell lifter station 63 for holding constantly at a fixed height the uppermost photovoltaic cell 11 stacked in cassette 61, cell inspection station 64 for inspecting for chipped or broken photovoltaic cells 11, tilt correction station 65 for correcting the tilt of photovoltaic cells 11, and cell transfer station 66 for transferring photovoltaic cells 11 are arranged in number one cell supply unit 32A in the Y direction at fixed intervals.

Cassettes 61 supplied to cell supply station 62 are loaded manually or automatically onto lifter 63a of cell lifter station 63 and the uppermost photovoltaic cell 11 stacked in cassette 61 is held constantly at a fixed height by lifter 63a. In other words, the position of the upper surface of the uppermost photovoltaic cell 11 is detected using a height detection sensor not shown in the drawings so that even if stacked photovoltaic cells 11 are supply sequentially, the uppermost photovoltaic cell 11 can be constantly held at a fixed height.

Inspection camera 67 for capturing images of supplied photovoltaic cells 11 from above is provided on cell inspection station 64, and by processing images captured by inspection camera 67, it is possible to detect defects such as breakages or chips in photovoltaic cells 11.

At tilt correction station 65, the tilt of photovoltaic cells 11 is corrected by pushing supplied photovoltaic cells 11 against reference block 69 using pushing member 68. Also, opening/closing door 65a is provided on the underside of tilt correction station 65 in order to discard photovoltaic cells 11 on which a defect was detected by inspection camera 67, and waste box 70 is provided below opening/closing door 65*a*.

Photovoltaic cells 11 are conveyed consecutively and simultaneously by three cell transfer hands 71*a*, 71*b*, and 71*c* via a pick and place action from cell lifter station to cell inspection station 64, from cell inspection station 64 to tilt correction station 65, and from tilt correction station 65 to cell transfer station 66. That is, cell transfer hands 71*a*, 71*b*, and 71*c* are provided on a hand device omitted from the drawings which is provided on cell supply unit 32A, and photovoltaic cells are picked up and held by cell transfer hands 71*a*, 71*b*, and 71*c* and conveyed consecutively to the next station by the pick and place movement of the hand device which is omitted from the drawings and which can be moved in the Y direction and up/down direction.

Figure 9:
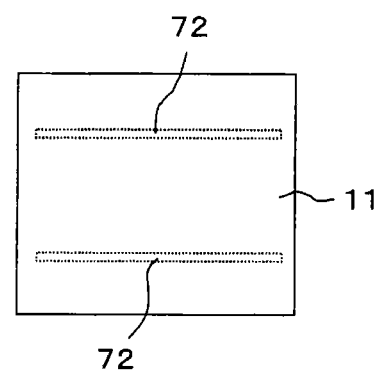
FIG. 9 This is a top view of a photovoltaic cell with flux applied.

A total of four dispenser nozzles 73*a* and 73*b*, two each upper and lower, for dispensing two rows of flux 72 (refer to FIG. 9) to the upper and lower surfaces respectively of photovoltaic cells 11 are provided between tilt correction station 65 and cell transfer station 66. Dispenser nozzles 73*a* and 73*b* apply flux 72 to the upper and lower surfaces respectively of photovoltaic cells 11 conveyed to cell transfer station 66 from tilt correction station 65 by cell transfer hand 71*c*.

Figure 10:
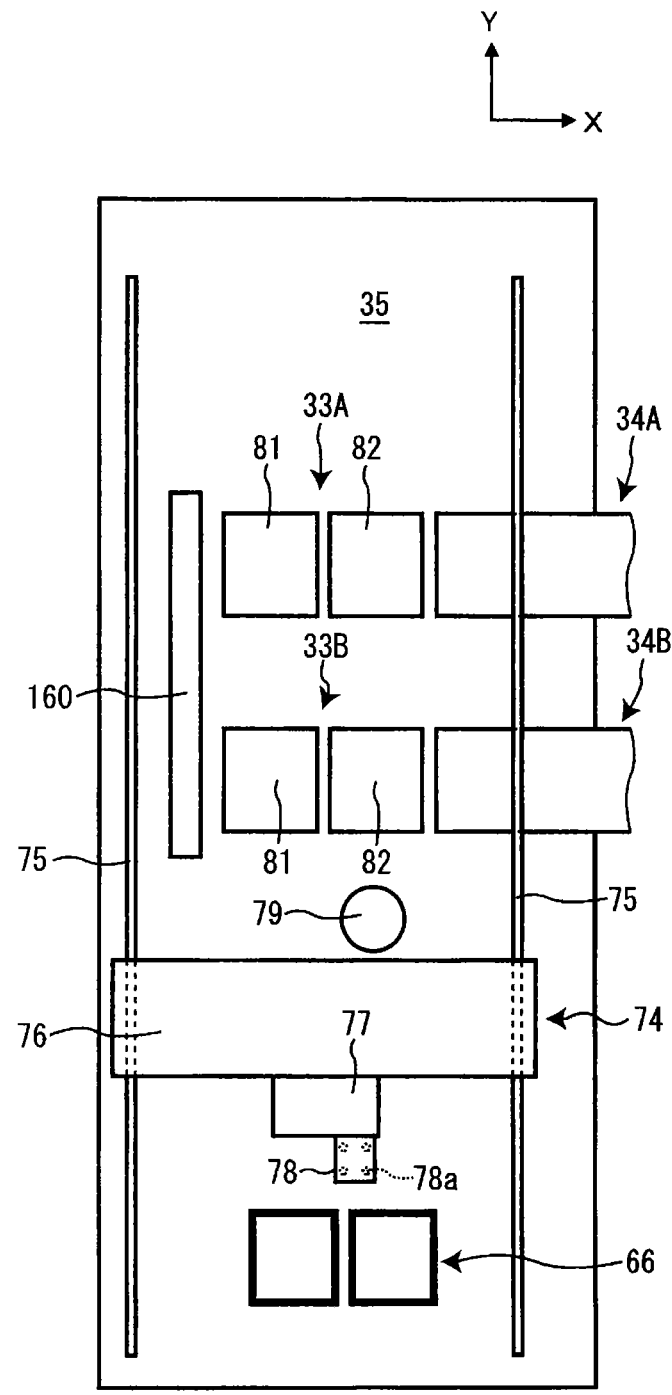
FIG. 10 This is an outline top view showing the carrier head of the cell supply unit.

As shown in FIG. 10, work robot 74 for conveying photovoltaic cells 11 to each lower section hot plate 81 of number one and number two joining units 33A and 33B from cell transfer station 66 is arranged between cell transfer station 66 of number one and number two cell supply units 32A and 32B, and number one and number two joining units 33A and 33B. Work robot 74 is shared between number one and number two cell supply units 32A and 32B. Work robot 74 comprises Y slide 76 which is slidably guided along guide rails 75 provided in the Y direction, X slide 77 which is slidably guided along Y slide 76 in the X direction, and carrier head 78 which is attached movably in the up/down direction to X slide 77. Pickup hand 78*a* for picking up photovoltaic cells 11 is provided on carrier head 78. For stringing device 21 of the present embodiment, because work robot 74 is only for performing the operation of moving photovoltaic cells 11 from cell transfer station 66 onto lower section hot plate 81, only one carrier head 78 is attached.

An image of the pickup state of photovoltaic cells 11 conveyed to number one and number two joining units 33A and 33B from cell transfer station 66 by carrier head 78 is captured during conveyance by camera 79 and items such as the position deviation are corrected based on image recognition.

Number two cell supply unit 32B has the same configuration as the above number one cell supply unit 32A, and photovoltaic cells 11 are supplied into lower section hot plate 81 of number two joining unit 33B with flux 72 applied to the upper and lower surfaces of supplied photovoltaic cells which have the light receiving surface facing up.

Figure 11:
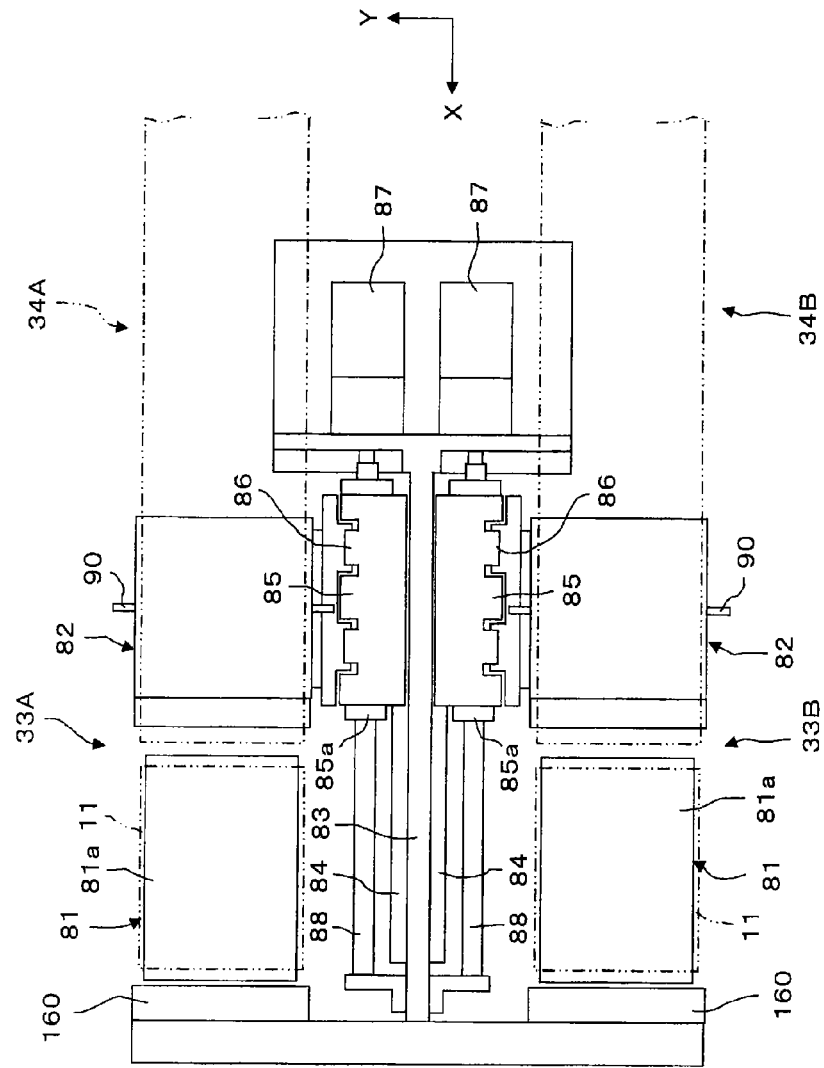
FIG. 11 This is a top view showing the joining units of the stringing device.

As shown in FIG. 11, number one and number two joining units 33A and 33B each have fixed lower section plate 81 and movable upper section hot plate 82. Number one and number two joining units 33A and 33B are interposed by fixed block 83 which is arranged between number one and number two joining units 33A and 33B, and are arranged separated from each other in the Y direction by a predetermined amount, and are linked to each end (start section) of number one and number two cell conveyance unit 34A and 34B.

Because number joining unit 33A and number two joining unit 33B have basically the same configuration, below the configuration of number one joining unit 33A is described based on FIG. 11 and FIG. 12.

A heater for pre-heating upper surface 81*a* of lower section hot plate 81 is embedded within lower section hot plate 81 of number one joining unit 33A, and a heater for heating lower surface 82*a* of upper section hot plate 82 is embedded within upper section hot plate 82.

On number one joining unit 33A, guide rail 84 is provided along the X direction in the side surface of fixed block 83 which is arranged on base 35. Moving platform 85 is guided movably in the X direction by a predetermined amount along guide rail 84 and upper section hot plate 82 is attached movably up/down by a predetermined amount on guide rail 86 which is provided on that moving platform 85.

Ball screw axis 88 moved by motor 87 is attached to fixed block 83 so that it is capable of being rotated around an axis line parallel to the X direction, and ball nut 85*a* fixed to moving platform 85 is engaged with that ball screw axis 88. The upper section hot plate 82 is positioned at the upper position of lower hot plate 81 by moving platform 85 being guided along guide rail 84 and moved a predetermined amount in the X direction by the rotation of ball screw axis 88. In that state, by lowering upper section hot plate 82 guided along guide 86 via a raising/lowering device omitted from the drawings, between lower section hot plate 81 and upper section hot plate 82, photovoltaic cell 11 and interconnectors 12 are pressed together while having heat applied.

As shown in FIG. 13, interconnectors 12 (12*a*) of a predetermined length supplied by number one connector supply unit 31A are loaded in multiple rows (two rows) on upper surface 81*a* of lower section hot plate 81. Also, photovoltaic cell 11 with flux 72 applied to the upper and lower surfaces is mounted on these interconnectors 12 so that flux 72 applied to the lower surface contacts interconnectors 12, and further, interconnectors 12 of a predetermined length are mounted in multiple rows (two rows) at a position contacting flux 72 applied to the upper surface of photovoltaic cell 11. In other words, photovoltaic cell 11 and interconnectors 12 on the upper and lower surfaces thereof are loaded on lower section hot plate 81 in a layered state.

In that state, by the lowering and X direction movement of upper section hot plate 82, interconnectors 12 and photovoltaic cell 11 are sandwiched between lower section hot plate 81 and upper section hot plate 82, and by pressing together interconnectors 12 and photovoltaic cells 11 while applying heat, interconnectors 12 are joined to the positive electrode and negative electrode of photovoltaic cell 11 via flux 72.

Guide groove 89 is formed along the Y direction on the central part in the X direction in lower surface 82*a* of upper section hot plate 82 of number one joining unit 33A. Retainer plate 90 acting as a retainer member is stored in guide groove 89 such that it can be protruded/retracted from/into lower surface 82*a* of upper section hot plate 82. Retainer plate 90 is pressed in the direction protruding from the lower surface of upper section top plate 82 by the biasing force of a spring omitted from the drawings, and is normally held in a position protruding by a predetermined amount from lower surface 82*a* of upper section hot plate 82.

By this, before pressing together with heat photovoltaic cell 11 and interconnectors 12 by lowering upper section hot plate 82, interconnectors 12 are pressed by retainer plate 90 and the spring force, so that the positional deviation between interconnectors 12 and photovoltaic cell 11 is reduced.

Also, retainer plate 90 is used to continue pressing interconnectors 12 with the spring force even after photovoltaic cell 11 and interconnectors 12 have been pressed together with heat and upper section hot plate 82 has been raised. By this, the positional deviation between photovoltaic cell 11 and interconnectors 12 is regulated for the time it takes for welded flux 72 to harden. As a result, interconnectors 12 can be joined to photovoltaic cell 11 accurately at a specified position.

Further, in FIG. 11, 160 is a duct, and by removing air from the area around joining units 33A and 33B via this duct 160, it functions as a smoke removal device which intakes smoke which occurs during the heat pressing.

Number two joining unit 33B is configured the same as the above number one joining unit 33A. A point that differs between number one joining unit 33A and number two joining unit 33B is that photovoltaic cells 11 are supplied to lower section hot plate 81 of number one joining unit 33A in an orientation with the light receiving surface facing down by number one cell supply unit 32A. In contrast, photovoltaic cells 11 are supplied to lower section hot plate 81 of number two joining unit 33B in an orientation with the light receiving surface facing up by number two cell supply unit 32B.

Number one cell conveyance unit 34A has an X direction length sufficient to simultaneously hold a predetermined amount Xm or greater of photovoltaic cells 11 conveyed onto lower section hot plate 81 of number one joining unit 33A. As shown in FIG. 14, number one cell conveyance unit 34A has a pair of conveyance members 91 which convey photovoltaic cells 11 joined with interconnectors 12.

Holding grooves 92 are provided in two rows along both sides in the X direction on the upper surface of lower section hot plate 81 such that these conveyance members 91 can be held within thereof. Conveyance members 91 scoop up photovoltaic cells 11 over lower section hot plate 81 and convey them to the start end of number one cell supply unit 34A by the lift and carry operation of number one cell conveyance unit 34A, in other words, by the box movement of raising a→ forwarding b→ lowering c→ retracting d.

Conveyance members 91 are normally held in an origin position embedded within holding grooves 92, and when the joining of photovoltaic cell 11 and interconnectors 12 is completed, they are raised and photovoltaic cell 11 is scooped up. After that, photovoltaic cell 11 is conveyed one pitch and held on fixed support table which is omitted from the drawings of number one cell conveyance unit 34A by advancing and lowering conveyance members 91.

Figure 15:
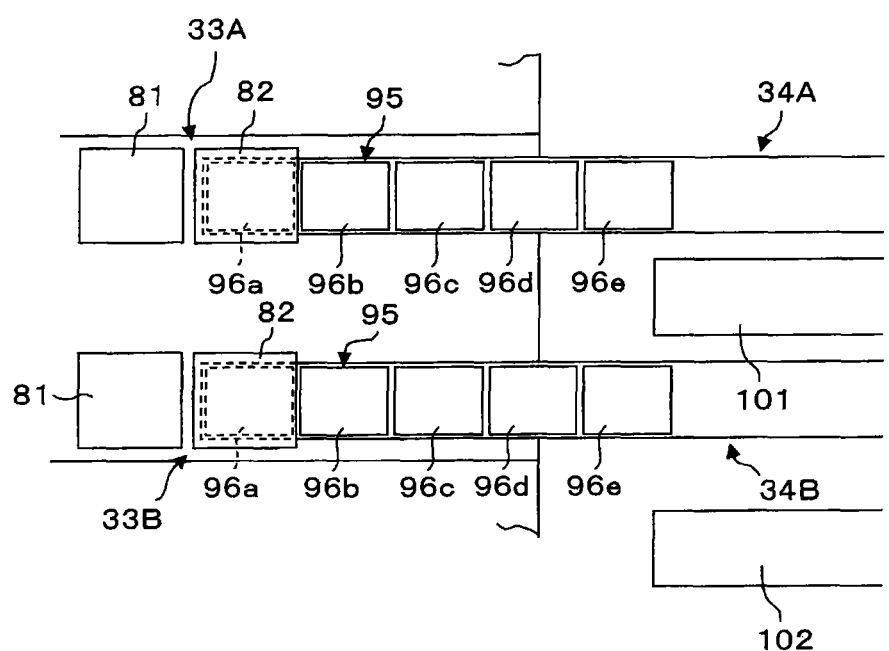
FIG. 15 This is an outline top view showing the slow cooling station of the cell conveyance unit.

As shown in FIG. 15, slow cooling station 95 for slow cooling photovoltaic cells 11 conveyed by one pitch each from lower section hot plate 81 is provided at the start end of number one cell conveyance unit 34A.

Slow cooling station 95 comprises multiple slow cooling heaters 96a, 96b, 96c . . . arranged along the X direction at intervals of the conveyance pitch of photovoltaic cells 11. Multiple slow cooling heaters 96a, 96b, 96c . . . have the heater temperature set gradually lower in order to slowly and by levels lower the temperature of photovoltaic cells 11 conveyed from lower section hot plate 81, and the warping of photovoltaic cells 11 is reduced by the slow cooling.

For this, photovoltaic cell 11 conveyed from lower section hot plate 81 by number one cell conveyance unit 34A is first conveyed onto number one slow cooling heater 96a set to a predetermined temperature, and photovoltaic cell 11 heated by hot plates 81 and 82 is cooled to a predetermined temperature by number one slow cooling heater 96a. Continuing, photovoltaic cell 11 is conveyed onto and cooled by number two slow cooling heater 96b which is set to a lower predetermined temperature than number one slow cooling heater 96a, and is further conveyed onto and cooled by number three slow cooling heater 96c which is set to a lower predetermined temperature than number two slow cooling heater 96b.

In this way, photovoltaic cells 11 are slowly cooled in levels by slow cooling station 95 comprising three to five slow cooling heaters 96a, 96b, 96c . . . and warping of photovoltaic cells 11 due to sudden lowering of temperature is reduced. The slow cooling means for slow cooling photovoltaic cells 11 is slow cooling station 95 which comprises these multiple slow cooling heaters 96a, 96b, 96c . . . .

Number two cell conveyance unit 34B has the configuration as the above number one cell conveyance unit 34A, the only difference being whether photovoltaic cells are conveyed with the light receiving surface facing down or facing up.

Figure 16:
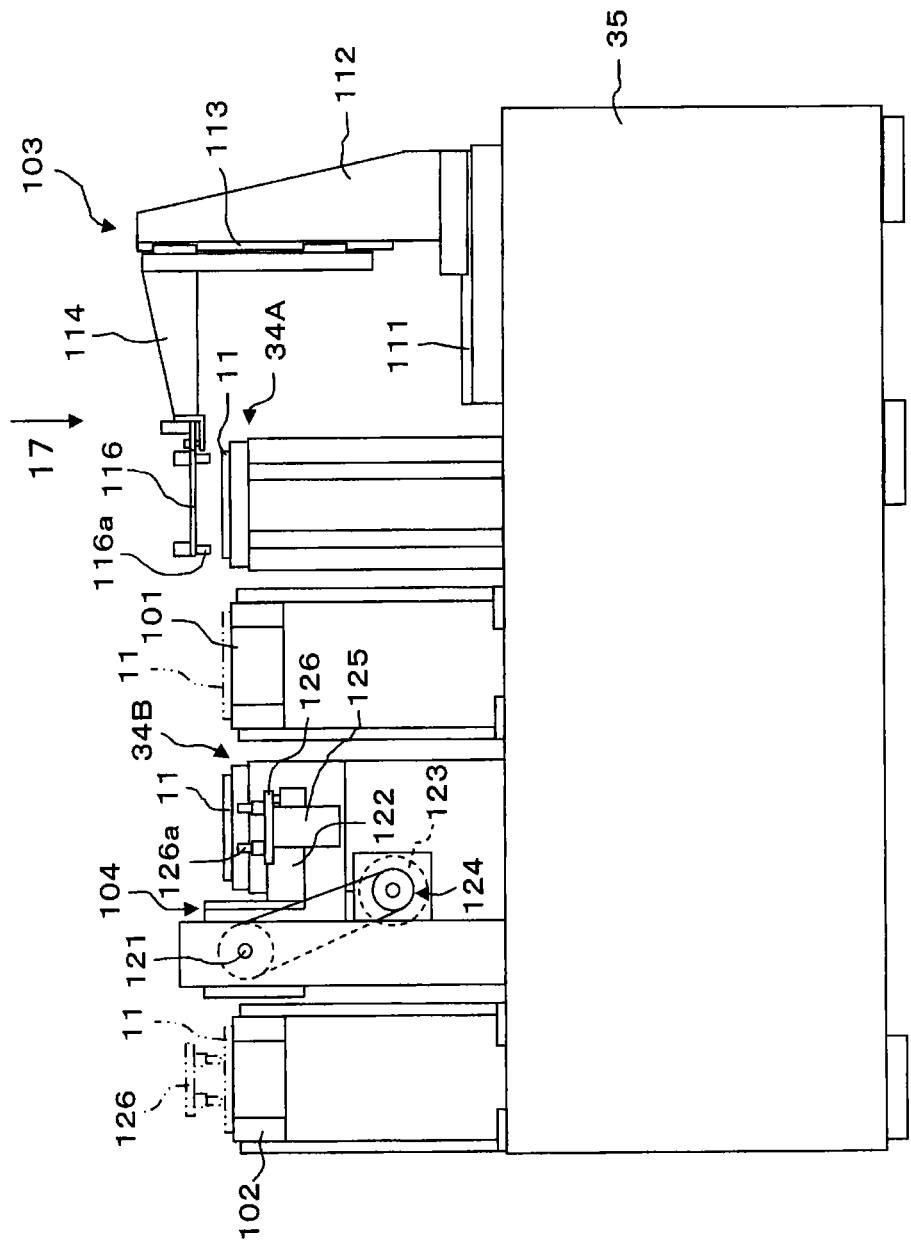
FIG. 16 This is a drawing showing the cell conveyance unit as viewed from the direction of arrow 16 of FIG. 4.
Figure 17:
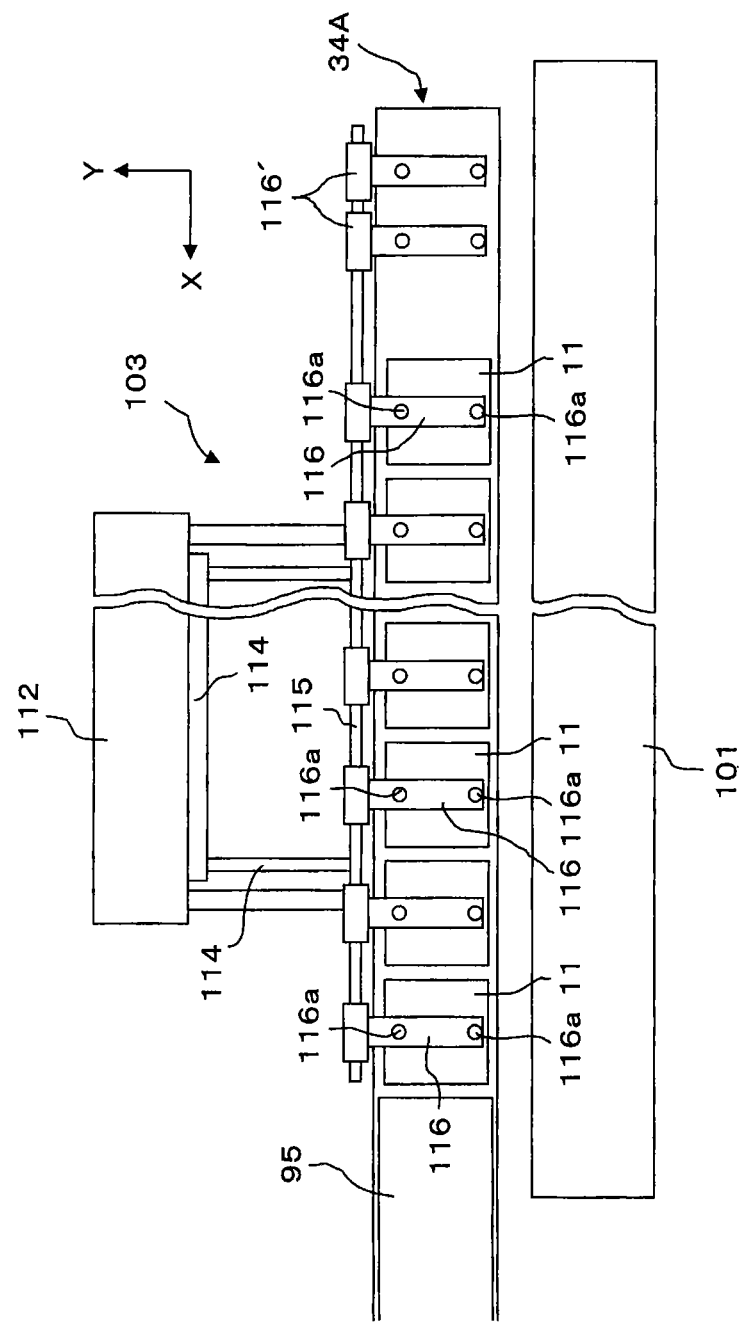
FIG. 17 This is a drawing of the view from the direction of arrow 17 of FIG. 16.

As shown in FIG. 16 and FIG. 17, number one cell stand 101 and moving device 103 are arranged on each side of number one cell conveyance unit 34A. Moving device 103 is an item for moving number one photovoltaic group 110A made from a predetermined quantity of photovoltaic cells 11 conveyed by number one cell conveyance unit 34A onto number one cell stand 101.

Moving device 103 comprises moving platform 112 movably guided along guide rail 111 provided in the Y direction on base 35, raising/lowering platform 114 attached to be movable up and down on guide rail 113 which is formed in the up/down direction in moving platform 112, and multiple pickup heads 116 attached to be adjustable in the X direction to holding rail 115 which is attached on raising/lowering platform 114. A quantity of pickup heads 116 is provided that can pick up at least each of the predetermined quantity (Xm) of photovoltaic cells 11 which make up number one photovoltaic cell group 110A, and a pair of pickup hands 116a are respectively attached to these pickup heads 116 to pick up the upper surface of photovoltaic cells 11.

In order to support different types of photovoltaic modules 10, the present embodiment is provided with only "a" (2) excess pickup heads 116 are provided, and usually excess pickup heads 116' are retracted to a position so as not to obstruct the pickup of number one photovoltaic cell group 110A.

Pickup hands 116a respectively contact the upper surface of each photovoltaic cell 11 on number one cell conveyance unit 34A by the lowering of raising/lowering platform 114 and pick up each photovoltaic cell 11 simultaneously by vacuum pickup. Further, number one photovoltaic cell group 110A picked up by pickup hands 116a are moved onto number one cell stand 101 by the raising of raising/lowering platform 114 and the advancing of moving platform 112.

As shown in FIG. 16, number two cell stand 102 is provided next to number two cell conveyance unit 34B and inverting/moving device 104 is provided between number two cell stand 102 and number two cell conveyance unit 34B. Inverting/moving device 104 is an item for inverting and transferring number two photovoltaic group 110B made from a predetermined quantity of photovoltaic cells 11 conveyed by number two cell conveyance unit 34A onto number two cell stand 102.

Inverting/moving device 104 comprises inverting stand 122 which is attached rotatably around spindle 121 which is parallel in the X direction above base 35, inversion moving device 124 with a power source of motor 123 which inverts this inverting stand 122 by 180 degrees, slider 125 which is attached to inverting stand 122 such that it can be slid a predetermined amount, and multiple pickup heads 126 attached to be adjustable in the X direction on slider 125.

In the same way as for pickup heads 116 of moving device 103 above, "Xm+a" pickup heads 126 are provided, and a pair of pickup hands 126a are respectively attached to these pickup heads 126 to pick up the lower surface of a predetermined quantity of photovoltaic cells 11 which make up number two photovoltaic cell group 110B.

Pickup hands 126a contact the lower surface of each photovoltaic cell 11 on number two cell conveyance unit 34B by the sliding of slider 125 and pick up each photovoltaic cell 11 simultaneously by vacuum pickup. Further, number two photovoltaic cell group 110B picked up by pickup hands 126a are loaded in an inverted state onto number two cell stand 102 by the 180 degree inversion of inverting stand 122.

In other words, inverting/moving device 104 loads number two photovoltaic cell group 110B onto number two cell stand 102 after inverting them to be oriented with the light receiving surface facing down. By this, the light receiving surfaces of number one and number two photovoltaic cell groups 110A and 110B loaded onto number one and number two cell stands 101 and 102 are arranged in the same way facing down.

Layup device 22 is provided with respect to number one and number two cell stands 101 and 102 of stringing device 21. As shown in FIG. 4, cover glass 130 for arranging photovoltaic cell groups 110A and 110B in a predetermined quantity of rows in the Y axis direction is supplied automatically or manually from holding position P1 to layup device 22. Number one and number two photovoltaic cell groups 110A and 110B are conveyed to and laid up on cover glass 130 alternately from number one and number two cell stands 101 and 102.

For this, a pair of guide rails 131 are provided on layup device 22 along the Y direction across and above number one and number two cell stands 101 and 102, and carrier head 132 for conveying photovoltaic cell groups 110A and 110B is attached movably in the Y direction to guide rails 131. Raising/lowering stand 133 is attached to carrier head 132 such that it can be raised/lowered.

Although not shown in the drawings, in the same way as for moving device 103 above, a support rail is attached to raising/lowering stand 133, and multiple (Xm+a) pickup heads are attached to this support rail to be adjustable in the X direction. Pairs of pickup hands for respectively picking up the upper surface of the predetermined quantity of photovoltaic cells 11 which make up photovoltaic cell groups 110A and 110B are attached to the pickup heads.

The pickup hands respectively contact the upper surface of each photovoltaic cell 11 of photovoltaic cell groups 110A and 110B which are moved onto number one or number two cell stand 101 and 102 by the lowering of raising/lowering stand 133 and pick up each photovoltaic cell 11 simultaneously by vacuum pickup. Further, photovoltaic cell groups 110A and 110B which have been picked up are conveyed above cover glass 130 supplied to layup device 22 by the raising of raising/lowering stand 133 and the Y direction movement of carrier head 132, and photovoltaic cell groups 110A and 110B are mounted onto cover glass 130 by the lowering of raising/lowering stand 133. Here, number one photovoltaic cell group 110A conveyed from number one cell stand 101 and number two photovoltaic cell group 110B conveyed from number two cell stand 102 are mounted on cover glass 130 alternately in the Y direction.

When just the predetermined quantity of rows (Yn) of photovoltaic cell groups 110A and 110B have been mounted in the Y direction on cover glass 130, cover glass 130 is conveyed via conveyor 25 to matrixing device 23.

Figure 18:
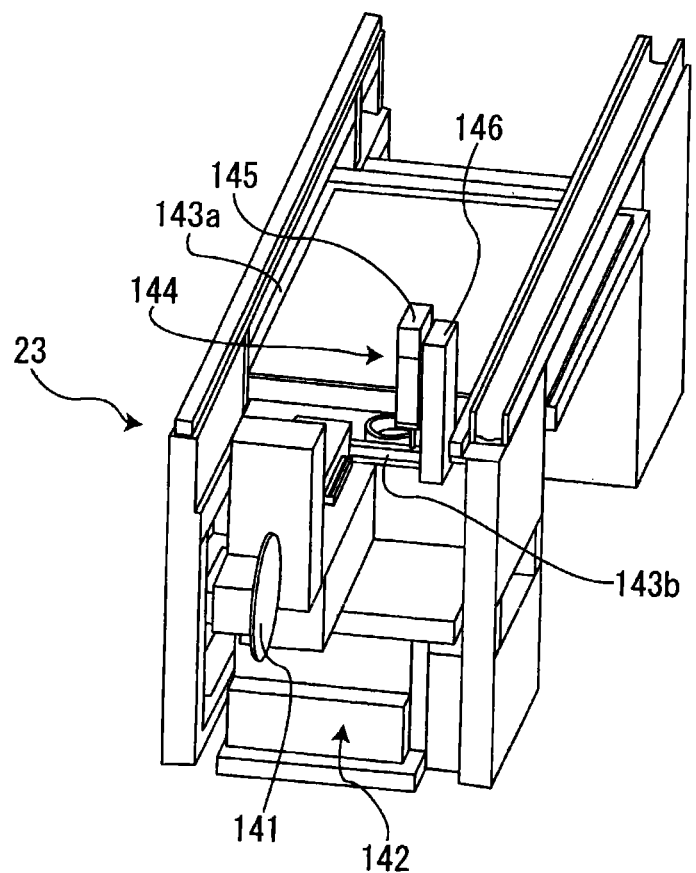
FIG. 18 This is a perspective view showing the matrixing device.

As shown in FIG. 18, matrixing device 23 comprises busbar supply unit (conductive member supply unit) 142 which supplies busbars 14 (refer to FIG. 1) which act as a conductive member and are wound around bobbin 141, and work robot 144 which is movable in the X and Y directions along guide rails 143a and 143b.

Busbar supply unit 142 pulls out in the Y direction busbars 14 which are wound around bobbin 141, cuts them to a predetermined length, and supplies the cut busbars 14 to a predetermined position. Carrier head 145 provided with a pickup member for picking up busbar 14 which has been cut to a predetermined length and processing head 146 with heater 146a for welding busbar 14 attached and embedded within are attached movably in the up/down direction to work robot 144.

Figure 19:
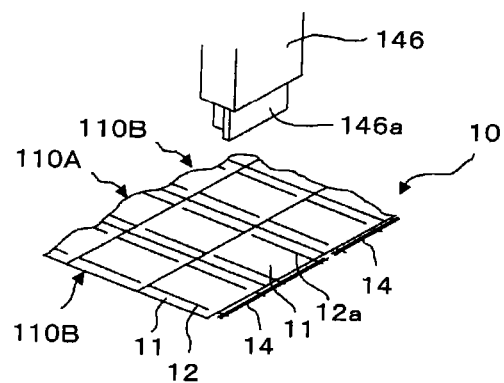
FIG. 19 This is a drawing showing the state of being wired in a matrix.

Further, when cover glass 130 is conveyed from layup device 22 to a predetermined position by conveyor 25, busbars 14 supplied to a predetermined position by busbar supply unit 142, as shown in FIG. 19, are mounted in order across the ends of interconnectors 12 protruding from the right end of each of number one and number two photovoltaic cell groups 110A and 110B which are next to each other in the Y direction by carrier head 145 of work robot 144. Thereafter, busbar 14 is welded and busbar 14 and interconnectors 12 connected electrically by heater 146a of processing head 146 of work robot 144.

When matrixing is complete for the right end of photovoltaic cell groups 110A and 110B, cover glass 130 is conveyed a predetermined amount by conveyor 25, and then in that state, in the same way as above, as well as mounting in order busbar 14 across interconnectors 12 protruding from the left end of each of number two and number one photovoltaic cell groups 110B and 110A which are next to each other in the Y direction, busbar 14 is welded and busbar 14 and interconnectors 12 connected electrically. By this, all of the Xm×Yn photovoltaic cells 11 which have been matrixed are electrically connected in series.

Here, instead of busbar 14, an interconnector may be used and this interconnector joined to the above interconnectors 12 via flux.

Next, a stringing method for photovoltaic cells 11 and a method for manufacturing photovoltaic modules 10 by combing strung photovoltaic cell groups 110A and 110B based on the above embodiment are described.

First, in the original state shown in FIG. 6 (A) in which the ends of interconnectors 12 pulled out from each bobbin 41 of number one and number two connector supply units 31A and 31B are clamped by number one clamper 51, number two ball screw axis 48 is rotated a predetermined amount by number two motor 49 and, as shown in FIG. 6 (B), number one clamper 51 is moved to the forward position and interconnectors 12 are pulled to a predetermined position. In that state, cutter 43 is lowered and interconnectors 12 are cut to a predetermined length.

Next, number one ball screw axis 47 is rotated a predetermined amount by number one motor 46 and, as shown in FIG. 6 (C), number one clamper 51 and moving guide 50 are moved as one with moving platform 45. By this, number one clamper 51 is moved above lower section hot plate 81, and the predetermined length of interconnectors 12 which are clamped by this are supplied onto photovoltaic cell 11 loaded on lower hot plate 81. Conversely, number two clamper 52 is unclamped and retracted a specified amount.

Next, number two clamper 52 is advanced a specified amount with interconnectors 12 clamped, and interconnectors 12 are pulled to cutter 43 front position (refer to FIG. 6 (D)). At the same time, number one clamper 51 is unclamped and, along with moving platform 45, number one clamper 51 is returned to its original position by number one and number two motors 46 and 49 (refer to FIG. 6 (A)).

Here, two types of interconnectors 12 are cut, short ones of a length to be joined to photovoltaic cells 11 at each end of photovoltaic cell groups 110A and 110B, and long ones of a length to join adjacent photovoltaic cells to each other. In other words, when joining interconnectors 12 to the first photovoltaic cell 11 of photovoltaic cell groups 110A and 110B, first, short interconnectors 12 are supplied in two rows each to a specified position above each lower section hot plate 81 of number 11 and number 2 joining units 33A and 33B.

Next, photovoltaic cell 11 supplied first with its light receiving surface facing down by number one cell supply unit 32A, with flux 72 having been applied to both its upper and lower surfaces, is supplied onto interconnectors 12 on lower section hot plate 81 of number one joining unit 33A. At the same time, photovoltaic cell 11 supplied first with its light receiving surface facing up by number two cell supply unit 32B, with flux 72 having been applied to both its upper and lower surfaces, is loaded onto the latter half of interconnectors 12 on lower section hot plate 81 of number two joining unit 33B.

Thereafter, the front half of long interconnectors is supplied respectively to photovoltaic cell 11 with its light receiving surface facing down and photovoltaic cell 11 with its light receiving surface facing up. As a result of this, as shown in FIG. 13 (A), photovoltaic cell 11 and interconnectors 12 are loaded on each lower section hot plate 81 of number one and number two joining units 33A and 33B in a layered state.

Next, by the lowering and X direction movement of upper section hot plate 82, interconnectors 12 and photovoltaic cell 11 are sandwiched between lower section hot plate 81 and upper section hot plate 82, and by pressing together interconnectors 12 and photovoltaic cells 11 while applying heat, interconnectors 12 are joined to the positive electrode and negative electrode of photovoltaic cell 11 via flux 72.

Figure 12:
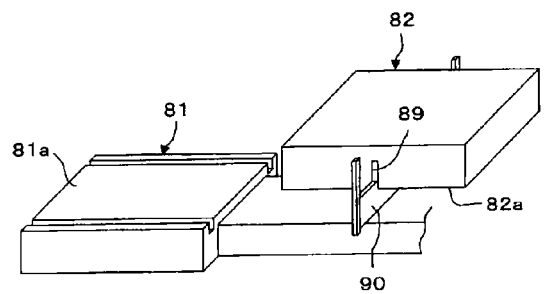
FIG. 12 This is a drawing showing the retainer member provided on the upper section hot plate of the joining unit.

Here, by the lowering of upper section hot plate 82, retainer plate 90 shown in FIG. 12 presses against interconnectors 12 on photovoltaic cell 11 from above with the spring force, so the positional deviation between interconnectors 12 and photovoltaic cell 11 layered on each other can be reduced.

Thereafter, as well as each upper section hot plate 82 being raised, they are moved a predetermined amount in the X direction and retracted from above lower section hot plate 81. By this, interconnectors 12 are joined via flux 72 to the upper and lower surfaces of photovoltaic cell 11.

Here, because retainer plate 90 continues to press against interconnectors 12 by the spring force even when upper section hot plate 82 is raised, while welded flux 72 is hardening, the positional deviation between photovoltaic cell 11 and interconnectors 12 is regulated.

Photovoltaic cell 11 to which interconnectors 12 have been joined are scooped up by conveyance members 91 and conveyed by one pitch each by the lift and carry operation of number one and number two cell conveyance units 34A and 34B. By this, the first photovoltaic cell 11 is conveyed from lower section hot plate 81 onto number one slow cooling heater 96a and slow cooled. By this one pitch conveyance, the latter half of interconnectors 12 joined to the upper surface of photovoltaic cell 11 is positioned above lower section hot plate 81.

Next, the second photovoltaic cell 11, in the same way as above, is supplied onto lower section hot plate 81 with flux 72 having been applied by number one and number two cell supply unit 32A and 32B and is loaded onto the latter half of interconnectors 12 positioned on lower section hot plate 81.

Then, long interconnectors 12, in the same way as above, are supplied onto lower section hot plate 81 by number one and number two connector supply units 31A and 31B and the front half thereof is layered (refer to FIG. 13 (B)) on photovoltaic cell 11. In that state, upper section hot plate 82 is operated and interconnectors 12 are joined via flux 72 to the upper and lower surfaces of photovoltaic cell 11.

Thereafter, by the lift and carry operation of number one and number two cell conveyance units 34A and 34B, at the same time as the first photovoltaic cell 11 being conveyed from number one slow cooling hit 96a to number two slow cooling heater 96b, the second photovoltaic cell 11 is conveyed from lower section hot plate 81 to number one slow cooling heater 96a.

By repeating operation in this way, photovoltaic cells 11 to which interconnectors 12 have been joined are conveyed in order by one pitch each by number one and number two cell conveyance units 34A and 34B. As a result, number one and number two photovoltaic cell groups 110A and 110B made from a predetermined quantity of photovoltaic cells 11 are conveyed on number one and number two cell conveyance units 34A and 34B.

In this way, because number one and number two photovoltaic cell groups 110A and 110B can be manufactured by the same joining process (refer to FIG. 13) for building up in order from below interconnectors 12, photovoltaic cells 11 and interconnectors 12, the work of stringing photovoltaic cell groups 110A and 110B can be performed easily.

Further, for the interconnectors to be joined to the last photovoltaic cell 11 of number one and number two photovoltaic cell groups 110A and 110B too, short ones are used, and short interconnectors 12a are joined to the reverse surface (upper surface) of photovoltaic cell 11 by number one joining unit 33A and short interconnectors 12a are joined to the light receiving surface (upper surface) of photovoltaic cell 11 by number two joining unit 33B.

When photovoltaic cell groups 110A and 110B made from the required quantity of photovoltaic cells 11 are conveyed onto number one and number two cell conveyance units 34A and 34B respectively, the next photovoltaic cell groups 110A and 110B should be manufactured on number one and number two joining units 33A and 33B, and the above operation is repeated once again with the first photovoltaic cell 11 being supplied at the same time as short interconnectors 12 being supplied.

By doing this, when the last photovoltaic cells 11 of photovoltaic cell groups 110A and 110B conveyed onto number one and number two cell conveyance unit 34A and 34B pass through slow cooling station 95, the upper surfaces of each photovoltaic cell 11 of number one photovoltaic cell group 110A on number one cell conveyance unit 34A are picked up by multiple pickup heads 116 of moving device 103 respectively, and are moved onto number one cell stand 101 by moving device 103 with their light receiving surface (negative electrode) facing down without changing their orientation. In other words, number one photovoltaic cell group 110A, as shown in FIG. 2, is moved onto number one cell stand 101 in a state in which short interconnectors 12a joined to the negative electrode of the first photovoltaic cell 11 are in a position under photovoltaic cell 11.

In the same way, the lower surfaces of each photovoltaic cell 11 of number two photovoltaic cell group 110B on number two cell conveyance unit 34B are picked up by multiple pickup hands 126a of inverting/moving device 104 respectively, and number two photovoltaic cell group 110B are inverted by the 180 degree inversion operation of inverting stand 122, and moving onto number two cell stand 102 in a state with the light receiving surface (negative electrode) facing down. In other words, number two photovoltaic cell group 110B, as shown in FIG. 3, is moved onto number two cell stand 102 in a state in which short interconnectors 12a joined to the positive electrode of the first photovoltaic cell 11 are in a position on top of photovoltaic cell 11.

As a result, number one and number two photovoltaic cell groups 110A and 110B moved respectively to number one and number two cell stands 101 and 102 are both oriented with their light receiving surface facing down, and for number one and two photovoltaic cell groups 110A and 110B which are arranged in the same direction, as shown in FIG. 2 and FIG. 3, the connection construction of interconnectors 12 with respect to photovoltaic cell 11 is alternately different.

In this way, number one and number two photovoltaic cell groups 110A and 110B conveyed onto number one and number two cell conveyance units 34A and 34B are conveyed onto number one and number two cell stands 101 and 102 by moving device 103 and inverting/moving device 104. By this, it is no longer necessary to keep more than necessary photovoltaic cells 11 on number one and number two cell conveyance units 34A and 34B, the above joining work and conveyance work can be continued, and stringing work can be performed efficiently.

Conversely, cover glass 130 for arranging two types of photovoltaic cell groups 110A and 110B in a predetermined quantity of rows alternately in the Y axis direction is supplied automatically or manually to the layup position of layup device 22, and photovoltaic cell groups 110A and 110B are conveyed alternately from number one and number two cell stands 101 and 102 onto this cover glass 130 by carrier head 132.

In other words, number one photovoltaic cell group 110A is mounted onto the first row of cover glass 130 from number one cell stand 101, and number two photovoltaic cell group 110B is mounted onto the second row of cover glass 130 from number two cell stand 102. Thereafter, number one photovoltaic cell groups 110A are mounted onto the odd number rows of cover glass 130 and number two photovoltaic cell groups 110B are mounted onto the even number rows of cover glass 130, and the required quantity of rows of photovoltaic cell groups 110A and 110B are arranged in the Y axis direction. By this, short interconnectors 12a joined to the negative electrode of photovoltaic cells 11 and short interconnectors 12a joined to the positive electrode of photovoltaic cells 11 are arranged alternating in the Y axis direction at both ends of photovoltaic cell groups 110A and 110B adjacent in the Y axis direction.

When Yn rows of photovoltaic cell groups 110A and 110B made from Xm strung photovoltaic cells 11 are mounted in the Y direction on cover glass 130, cover glass 130 is conveyed from layup device 22 to matrixing device 23 by conveyor 25.

When the front section (the right section in FIG. 4) of cover glass 130 is conveyed inside matrixing device 23, busbar 14 cut to a specified length is mounted between interconnectors 12a connected to the negative electrode protruding from the right end of the first row of photovoltaic cell group 110A and interconnectors 12a connected to the positive electrode protruding from the right end of the second row of photovoltaic cell group 110B.

The busbar 14 in question is pulled out in the Y direction from bobbin 141 of busbar supply unit 142 of matrixing device 23 and cut to a specified length, picked up and held by the pickup heads attached to carrier head 145 of work robot 144, and mounted between interconnectors 12a.

In the same way, busbars 14 are respectively mounted between interconnectors 12a protruding from the right ends of the third and fourth rows of photovoltaic cell groups 110A and 110B, and interconnectors 12a protruding from the right ends of the fifth and sixth rows of photovoltaic cell groups 110A and 110B.

In such a state, by pressing together while applying heat to the connection points between busbar 14 and interconnectors 12 using a heater embedded in processing head 146, busbar 14 is melted and interconnectors 12a joined to the negative electrode and interconnectors 12a joined to the positive electrode are electrically connected via busbar 14.

Next, cover glass 130 is conveyed a predetermined amount in the X direction, and when rear section (the left section in FIG. 4) of cover glass 130 is conveyed inside matrixing device 23, in the same way as above, busbar 14 cut to a specified length is mounted between interconnectors 12a connected to the negative electrode protruding from the left end of the second (fourth) row of photovoltaic cell group 110B and interconnectors 12a connected to the positive electrode protruding from the left end of the third (fifth) row of photovoltaic cell group 110A. And, by melting busbar 14 using processing head 146, interconnectors 12a joined to the negative electrode and interconnectors 12a joined to the positive electrode are electrically connected via busbar 14.

In this way, all of Xm×Yn photovoltaic cells 11 are connected electrically in series via interconnectors and busbars 14 and thus photovoltaic module 10 is manufactured. After that, the photovoltaic module 10 is conveyed to conveyor 26 and conveyed to the next process. And, in the next process, as well as the top of photovoltaic cells 11 being sealed with a resin such as EVA and a back sheet being mounted, the completed product is made by covering the circumference with an airtight aluminium frame.

According to the above embodiment, because number one joining unit 33A which joins alternately conductive members (interconnectors) 12 and photovoltaic cells 11 loaded with their light receiving surfaces facing up and because number two joining unit 33B which joins alternately conductive members 12 and photovoltaic cells 11 loaded with their light receiving surfaces facing down are provided (next to each other), stringing device 21 can be configured from the same connection process of conductive member 12 to photovoltaic cells 11 loaded respectively with the direction of their light receiving surface changed, in other words, it can have an easy configuration in which conductive members 12, photovoltaic cells 11, and conductive members 12 are just layered in order from the bottom and joined.

By this, two types of photovoltaic cell groups 110A and 110B with different conductive member 12 string structures can be easily manufactured and stringing device which can manufacture photovoltaic modules 10 efficiently can be realized.

The above embodiment comprises number one and number two cell supply units 34A and 33B which convey respectively in the X direction photovoltaic cells 11 joined with conductive members 12 by number one and number two joining units 33A and 33B, moving device 103 which moves number one photovoltaic cell groups 110A conveyed by number one cell conveyance unit 34A, and inverting/moving device 104 which inverts around an axis line parallel to the X direction and then moves number two photovoltaic cell group 110B conveyed by number two cell conveyance unit 34B.

By this, by just inverting photovoltaic cell group 110B conveyed by number two cell conveyance unit 34B using inverting/moving device 104, the direction of the light receiving surfaces of two types of photovoltaic cell groups 110A and 110B with different string structures can be made the same. Also, because photovoltaic cell group 110B is inverted around an axis line parallel to the X direction, it is possible to efficiently invert photovoltaic cell group 110B made from many photovoltaic cells 11 in a minimal space at the same time.

According to the above embodiment, number one and number two cell stands 101 and 102 are provided respectively next to number one and number two cell conveyance units 34A and 34B, and the configuration is such that as well as moving photovoltaic cell group 110A conveyed by number one cell conveyance unit 34A to number one cell stand 101 without inverting them using moving device 103, photovoltaic cell group 110B conveyed by number two cell conveyance unit 34B are moved to number two cell stand 102 in an inverted state by inverting/moving device 104.

By this, it is possible to move photovoltaic cell groups 110A and 110B rapidly to cell stands 101 and 102 every time photovoltaic cell groups 110A and 110B are conveyed by cell conveyance units 34A and 34B. As a result, as well as it not being necessary to interrupt stringing work until photovoltaic cell groups 110A and 110B are conveyed out by cell conveyance units 34A and 34B, the time photovoltaic cell groups 110A and 110B stay on cell conveyance units 34A and 34B can be reduced.

According to the above embodiment, because number one and number two joining units 33A and 33B join conductive members 12 and photovoltaic cell 11 via flux 72 by pressing them together while applying heat using lower section and upper section hot plates 81 and 82, as well as being as to join efficiently photovoltaic cell 11 and multiple rows of conductive members 12 layered on the upper and lower surfaces of photovoltaic cell 11, conductive members 12 can be joined to photovoltaic cell 11 without using expensive conductive members 12 coated with something such as solder.

According to the above embodiment, because number one and number two cell conveyance units 34A and 34B are provided with slow cooling means 95 along the X direction which cool photovoltaic cells 11 joined with conductive members 12 by each hot plate 81 and 82 of number one and number two joining units 33A and 33B, the warping of photovoltaic cells 11 due to the rapid cooling of photovoltaic cells 11 heated by hot plates 81 and 82 can be reduced.

According to the above embodiment, because two types of stringing are performed, with conductive members 12 being joined respectively to photovoltaic cell 11 loaded with the light receiving surface facing up and to photovoltaic cell 11 loaded with light receiving surface facing down, two types of photovoltaic cell groups 110A and 110B strung with different conductive member 12 string constructions can be easily manufactured using an easy method of joining in the same joining process of conductive members 12 to photovoltaic cells 11 loaded respectively with their light receiving surface oriented changed, and a stringing method which is capable of efficiently manufacturing photovoltaic modules 10 can be realized.

According to the above embodiment, because it has layup device 22 which arranges photovoltaic cell group 110A moved to number one cell stand 101 and photovoltaic cell group 110B moved to number two cell stand 102 on cover glass 130 which is for mounting photovoltaic cell groups 110A and 110B alternately in the Y direction which is orthogonal to the X direction, it is possible to manufacture photovoltaic modules 10 just by arranging photovoltaic cell groups 110A and 110B on cover glass 130 alternately from the two cell stands 101 and 102 using layup device 22.

According to the above embodiment, because it is provided with matrixing device 21 which electrically connects the respective conductive members 12 at each end of adjacent photovoltaic cell groups 110A and 110B arranged alternately in the Y direction on cover glass 130 using a separate conductive member 14, it is possible to connect in series all photovoltaic cells 11 which go to form photovoltaic module 10 using matrixing device 21.

According to the above embodiment, conductive members 12 and photovoltaic cells 11 loaded with their light receiving surface facing up are joined to each other, conductive members 12 and photovoltaic cells 11 loaded with their light receiving surface facing down are joined to each other, photovoltaic cells 11 with their light receiving surface facing up joined to conductive members and photovoltaic cells 11 with their light receiving surface facing down joined to conductive members 12 are conveyed by separate cell conveyance units 34A and 34B, and are arranged alternately on cover glass 130 in a direction orthogonal to the conveyance direction with the photovoltaic cells 11 conveyed by one of the cell conveyance units 34A not being inverted, and the photovoltaic cells 11 conveyed by the other of the cell conveyance units 34A being inverted.

By this, a photovoltaic module manufacturing method which is capable of manufacturing photovoltaic modules 10 efficiently is realized.

In the above embodiment, an example was given in which photovoltaic cell group 110B strung with the light receiving surface of photovoltaic cells 11 facing up are mounted on cover glass 130 after being inverted by inverting/moving device 104 so that the light receiving surface is facing down; however, it is acceptable for photovoltaic cell group 110A strung with the light receiving surface facing down to be inverted and mounted on the back sheet.

In the above embodiment, conductive members (interconnectors) 12 are joined to each electrode of photovoltaic cells 11 via flux 72, but if conductive members coated with solder are used as conductive members 12, it is possible to join the conductive members and photovoltaic cells 11 without applying flux.

In the above embodiment, an example was given in which multiple conductive members 12 and photovoltaic cells 11 were joined simultaneously by being heat pressed between lower section hot plate 81 and upper section hot plate 82, but this can also be performed by attaching a heater to an item such as a robot capable of moving in three dimensions.

Also, in the above embodiment, photovoltaic cell groups 110A and 110B conveyed by cell conveyance units 34A and 34B are moved onto cover glass 130 supplied to layup device 22 via cell stands 101 and 102; however, it is acceptable to move photovoltaic cell groups 110A and 110B directly from cell conveyance units 34A and 34B to layup device 22.

In such ways, the present invention is not limited to the configurations provided in the embodiment and there are various possible embodiments which do not extend beyond the range of the object of the present invention as given in the claims.

INDUSTRIAL APPLICABILITY

The stringing device and stringing method as well as photovoltaic module manufacturing device and manufacturing method of the present invention are suitable for use with photovoltaic modules in which adjacent photovoltaic cells are joined electrically via conductive members.

REFERENCE SIGNS LIST

10: Photovoltaic module; 11: Photovoltaic cell; 12, 14: Conductive member (interconnector, busbar); 21: Stringing device; 22: Layup device; 23: Matrixing device; 31A, 31B: Conductive member supply unit; 32A, 32B: Cell supply unit; 33A, 33B: Joining unit; 34A, 34B: Cell conveyance unit; 101, 102: Cell stand; 103: Moving device; 104: Inverting/moving device; 110A, 110B: Photovoltaic cell group; 130: Cover glass

The invention claimed is:

1. A stringing device for electrically connecting electrodes formed respectively in photovoltaic cells via a conductive member, comprising:
a number one joining unit which joins a first photovoltaic cell supplied with its light receiving surface facing up to a first conductive member;
a number two joining unit which joins a second photovoltaic cell supplied with its light receiving surface facing down to a second conductive member;
a number one cell conveyance unit and a number two cell conveyance unit which convey respectively in the X direction the first photovoltaic cell joined to the first conductive member and the second photovoltaic cell joined to the second conductive member;
a number one cell stand and a number two cell stand provided respectively next to the number one and number two cell conveyance units;
a moving device which moves one of the first photovoltaic and second photovoltaic cells conveyed by one of the number one and number two cell conveyance units to one of the number one and number two cell stands; and
an inverting-and-moving device which rotates around an axis line parallel to the X direction to move and invert the other one of the first photovoltaic and second photovoltaic cells conveyed by the other of the number one and number two cell conveyance units to the other of the number one and number two cell stands.

2. The stringing device according to claim 1, wherein the first photovoltaic cell conveyed by the number one cell conveyance unit is moved to the number one cell stand without inverting by using the moving device, and
the second photovoltaic cell conveyed by the number two cell conveyance unit is moved to the number two cell stand in an inverted state by the inverting-and-moving device.

3. The stringing device according to claim 1, wherein
the respective first and second conductive members have a length which straddles adjacent photovoltaic cells, an edge of the respective first and second conductive members is joined to one of the positive electrode or negative electrode of a first adjacent photovoltaic cell, and the other edge of the conductive member is joined to the other of either the negative electrode or positive electrode of a second adjacent photovoltaic cells.

4. The stringing device according to claim 1, wherein
the number one and number two joining units join the respective first and second conductive members and the respective first and second photovoltaic cells by pressing while applying heat using hot plates.

5. The stringing device according to claim 4, wherein
the respective first and second conductive members and the respective first and second photovoltaic cells are joined via flux.

6. The stringing device according to claim 4, wherein
the number one and number two cell conveyance units comprise a cooling station arranged in the X direction which cools the respective first and second photovoltaic cells to which the respective first and second conductive members have been joined by each of the hot plates of the number one and number two joining units.

* * * * *